United States Patent [19]

Pammer et al.

[11] 4,057,659

[45] Nov. 8, 1977

[54] SEMICONDUCTOR DEVICE AND A METHOD OF PRODUCING SUCH DEVICE

[75] Inventors: Erich Pammer, Munich; Friedrich Schnell, Haar, both of Germany

[73] Assignee: Siemens Aktiengesellschaft, Berlin & Munich, Germany

[21] Appl. No.: 584,147

[22] Filed: June 5, 1975

[30] Foreign Application Priority Data

June 12, 1974 Germany .............................. 2428373

[51] Int. Cl.² .............................................. B05D 5/12
[52] U.S. Cl. ...................................... 427/89; 156/656; 357/71; 427/90; 427/91; 427/224; 427/259; 427/264
[58] Field of Search ................ 427/38, 41, 82, 88–91, 427/123–125, 248, 250, 255, 258, 259, 261, 264, 287, 295, 300, 307, 309, 327, 328, 34, 223–225, 282; 156/3, 6, 7, 17; 357/71

[56] References Cited

U.S. PATENT DOCUMENTS

| | | | |
|---|---|---|---|
| 3,700,497 | 10/1972 | Epifano et al. | 427/90 X |
| 3,710,205 | 1/1973 | Swanson | 427/90 X |

FOREIGN PATENT DOCUMENTS

| | | | |
|---|---|---|---|
| 45-16727 | 6/1970 | Japan | 427/91 |
| 985,280 | 3/1965 | United Kingdom | 427/91 |

*Primary Examiner*—Thomas J. Herbert, Jr.
*Assistant Examiner*—Bruce H. Hess
*Attorney, Agent, or Firm*—Hill, Gross, Simpson, Van Santen, Steadman, Chiara & Simpson

[57] ABSTRACT

A semiconductor body having metal contacts is coated, except for the metal contacts, with a masking layer composed of a heat-resistant photo-lacquer or a polyimide resin which remains on the semi-conductor body as a protective layer on the finished semiconductor device. An intermediate metal coating consisting of at least two layers of different metals is vapor-deposited over the entire semiconductor body surface. The outer layer of metal is a soft-solderable metal, such as Cu, and is applied substantially thicker in relation to the underlying intermediate metal layers. Thereafter, any excess metal on the masking layer is removed therefrom by conventional etching techniques.

4 Claims, 5 Drawing Figures

SEMICONDUCTOR DEVICE AND A METHOD OF PRODUCING SUCH DEVICE

BACKGROUND OF THE INVENTION

1. Field of the Invention

The invention relates to a semiconductor device and somewhat more particularly to a semiconductor device which includes raised solderable contacts and a protective passivation layer along with a method of producing such a semiconductor device.

2. Prior Art

U.S. Pat. No. 3,761,309 (which corresponds to German DOS 2,032,872 and is assigned to the assignee of the present invention) discloses a method of producing a semiconductor body whereby metal contacts are provided on the body and the free body surface areas and the metal contacts are coated with an insulating layer which is then removed from the metal contacts. Thereafter, at least two different metal layers are applied onto the contacts, with the outer metal layer being composed of a soft-solderable metal and being of a thickness substantially greater than that of the underlying metal layer. The excess metal remaining on the surface of the insulating layer is removed via a photo-lacquer etching process. With this prior art method, a semiconductor element or body is provided in a generally known manner with a conductor path structure composed of, for example, Al and the entire surface of the resultant structure is coated with a SiO₂ layer. Thereafter, at least a portion of the Al contact structure is uncovered via conventional photo-etching techniques. Then, a relatively thin layer of, for example, Ti is applied over the entire surface of the resultant structure and then a layer of Au is deposited onto the Ti layer. The Au layer is galvanically reinforced or thickened after a photo-lacquer mask is applied, exposed and developed to protect the surface of the resultant structure at all areas except where the soft-solderable metal contacts are desired. Next, the protective photo-lacquer mask is removed and the metal layers above only the SiO₂ layer are etched away so that a raised solderable contact is provided. This prior art patent also discloses that the gold surface can be protected from solder by chemically precipitating Ni and/or Sn onto the gold surface.

Commonly assigned U.S. Ser. No. 540,458, filed Jan. 13, 1975, discloses a semiconductor device having a protective layer consisting of a heat-stabilized photo-lacquer material. In accordance with those teachings, a photo-lacquer is applied as a protective layer and is first heat-tempered at a temperature in the range of about 100° to 210° C. and preferably at 190° C. and then heat-tempered at a temperature in the range of 190° to 300° C. and preferably at 250° C.

SUMMARY OF THE INVENTION

The invention provides a semiconductor device having raised solderable contacts and an economic and effective passivation protective layer thereon as well as a method of producing such a device.

In accordance with the principles of the invention, layer of a heat-resistant organic insulating material, such as a photo-lacquer or a polyimide is applied over a semiconductor body having a contact path structure thereon, a layer of a soft-solderable metal, such as Cu, is applied onto select portions of the contact path structure (which has first been uncovered via conventional etching techniques) at least partially by a vapor deposition technique using the layer of insulating material as a vaporization mask and removing excess metal via etching techniques employing an etch mask composed of a photo-lacquer material.

DESCRIPTION OF THE PREFERRED EMBODIMENTS

Figure 1:
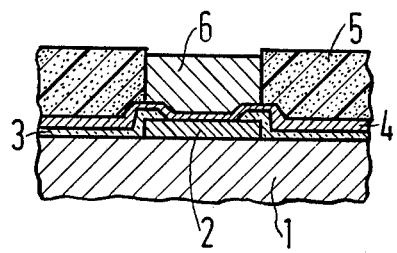
FIGS. 1 and 2 are elevated partial cross-sectional views of a semiconductor device under construction via prior art techniques.

In producing a semiconductor device via conventional techniques, one procures a semiconductor crystal 1 which is provided with a desired pn-junction, protective layers and metal contacts 2. For example, a disc-shaped silicon crystal 1 may be approrpriately doped to produce the desired conductivity characteristics within the crystal and then provide, as by vapor deposition techniques, with an electrode or metal contact 2, for example, composed of Al on a select surface portion of the crystal. Typically, the metal electrode 2 has a thickness ranging from about 0.8 $\mu$m to 1$\mu$m. by heating such a structure in a suitable reaction gas which is capable of thermally depositing SiO₂ (for example, methyl or ethyl siloxane diluted with argon or another inert gas), one obtains on the surface of the structure a passivation layer 3 composed of SiO₂. This passivation layer 3 is then subjected to conventional photo-lacquer etching techniques so as to uncover at least a portion of the surface of the electrode 2 while retaining the passivation layer on other portions of the structure. Thereafter, a lower intermediate metal layer, for example, composed of Ti and an upper intermediate layer, for example, composed of Cu is vapor deposited onto the entire surface of the arrangement. The resultant intermediate metal layer 4 generally has a maximum thickness of about 1 $\mu$m. A mask 5 composed of a photo-lacquer and having a thickness of about 35 $\mu$m is then applied onto the resultant structure, exposed and developed in such a way that the portion of the Ti-Cu metal layer 4 located directly above the metal electrode 2 is uncovered while the remaining portions of the layer 4 remain covered by the photo-lacquer layer 5. A suitable material for forming the mask is available under the trade name "Riston" (a three-layer sandwich of polyethylene, presensitized resist or photo-lacquer and polyester films). A cathode potential is then applied to the resultant structure via the semiconductor crystal 1 and/or the intermediate metal layer 4 and the so-arranged structure is placed in a suitable galvanization bath so that a relatively thick copper layer 6 deposits onto the uncovered metal layer 4 through the windows or openings in the mask 5. The so-deposited Cu layer 6 forms a rigid connection with the Ti-Cu metal layer 4 and with the Al contact or electrode 2. Thereafter, the mask 5 is removed via a suitable solvent and the resultant Cu "bump" forms the soft-solderable contact of electrode 2.

Figure 2:
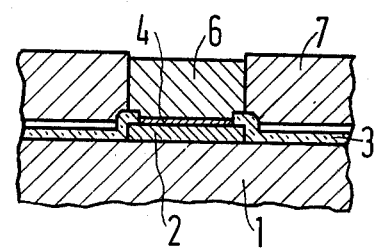

As illustrated in FIG. 2, the above described method may be varied so that initially the metal layer 4 and the soft-solderable metal layer 6 are applied onto the Al contact 2 by vapor deposition while using a vaporization mask 7 comprised of a heat-resistant metal, such as molybdenum. The windows or openings in mask 7 are dimensioned and arranged in such a manner that when the mask 7 is properly positioned with respect to the semiconductor body 1 having contact 2 and a SiO₂ layer 3 thereon, the windows will merely leave uncovered those portions of the contacts 2 on the semiconductor body which are to receive the soft-solderable metal layer 6.

The intermediate metal layer 4 which may consist of a layer of Ti when Al is used to form the electric contacts 2 on the semiconductor body 1, functions to provide a good mechanical connection between the contact metal, the semiconductor body and the SiO₂ layer on the one hand and the soft-solderable metal, for example, Cu, on the other hand. In the embodiment described with FIG. 1, the intermediate metal layer 4 consists of a lower layer of Ti and an upper layer of Cu in order to provide a sufficient adhesion strength to the galvanically deposited Cu, which is applied at a considerably lower temperature.

In accordance with the principles of the invention, a heat-resistant dielectric material from the class of organic insulating materials is used as the insulating layer which remains on the surface of the finished semiconductor device. Also, the metal of the intermediate layer (above the contact structure directly on the surface of the semiconductor body) and at least one lower partial layer of the soft-solderable metal is applied by vapor deposition at increased temperatures onto the contact structure and onto the insulating layer surrounding such contacts. At least a portion of the metal layers so-deposited onto the insulating layer are then removed by photo-lacquer etching techniques.

In one preferred embodiment of the invention, the heat-resistant organic insulating material is selected from the group consisting of heat-stabilized photo-lacquer and a heat-stabilized polyimide.

Figure 3:
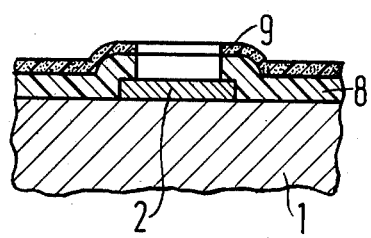
FIGS. 3-5 are somewhat similar views of a semiconductor device undergoing construction in accordance with the principles of the invention.

Referring now to FIG. 3 which illustrates a portion of a semiconductor body under construction in accordance with an embodiment of the invention and includes similar reference numerals to that of FIGS. 1 and 2 for similar elements. An insulating layer 8 which may be composed of a photo-lacquer is applied onto a semiconductor body 1 having a metal contact 2 thereon, for example, by use of centrifugal forces or by spray application. After application, the photo-lacquer is appropriate exposed and developed so that only the metal contact 2 on the semiconductor body is uncovered. The remaining portions of the photo-lacquer 8 are then rendered heat-resistant and remain on the finished semiconductor device as a protective layer. Generally, the conversion of a photo-lacquer material into a heat-resistant insulating material is accomplished by subjecting the photo-lacquer material to a first heat-treatment at temperatures in the range of about 100° to 210° C. and then subjecting the resulting material to a second heat-treatment at temperatures in the range of about 190° to 300° C.

Useful photo-lacquer materials for practice of the invention may be selected from the group consisting of negative photo-lacquers of the polyvinyl ester type, such as PV cinnamates, which are commercially available, for example, under the trade name KPR; positive photo-lacquers of the aromatic diazonium type, such as diazo quinone-phenol resins, which are commercially available, for example, under the trade name AZ 1350 H; partially cyclicized polyisoprenes which are commercially available, for example, under the trade name KTFR; and mixtures thereof.

Figure 4:
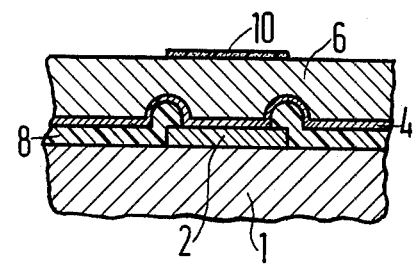

After the application of the insulating layer and the uncovering of the metal contact, a coherent first metal layer is applied onto the contact and surrounding surface area. Thereafter, a layer of a soft-solderable metal is applied by vapor deposition and, if necessary, by galvanic deposition. Any excess metal which may be present on the surface of the insulating layer (which remains as a protective layer on the semiconductor crystal) is removed by conventional photo-lacquer etching techniques (FIG. 4).

Figure 5:
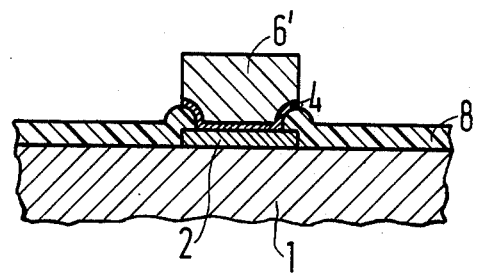

Another embodiment of the invention comprises applying a heat-resistant polyimide as an insulating layer. The selected polyimide is applied in the form of a prepolymerized material, preferably as a lacquer, and then partially removed from those areas which overlie the metal contact by various means, for example, by conventional photo-lacquer mask techniques. The remaining polyimide material is then converted into a heat-resistant or heat-stabilized material by a heat treatment. The resultant arrangement which now comprises a heat-resistant polyimide layer 8 having uncovered metal contact 2 on a semiconductor body 1, is then coated over the entire surface thereof with a relatively thin intermediate metal layer 4 and then with a relatively thick metal layer 6 composed of a soft-solderable metal. These metal layers may be applied by vapor deposition or galvanic deposition (FIG. 4). Thereafter, the metal directly adhering to the insulating layer 8 is removed (at least for the most part) by means of a photo-lacquer etching technique while the relatively thick layer 6 of soft-solderable metal remains on the contact 2 and guarantees that a contact between the semiconductor element 1 and another contact element can be established by means of soft solder connections (FIG. 5).

Certain types of polyimides which are commercially available, for example, under the trade name Pyre ML-Lacquers (duPont) may be applied, for example, by immersion or spraying in a manner similar to conventional photo-lacquer materials. Such polyimides at least partially react with certain alkaline developers (of the type used for certain photo-lacquers, i.e. of the type known as Az 1350 from Shipley) and swell or expand so that the resultant reacted material can be removed by washing, for example, with a water jet from the underlying material and/or from those portions of the polyimide layer which were not subjected to the influence of such a developer. Through a heat treatment of, for example, 300° to 400° C. for a time period of about 30 minutes, the portions of the polyimide layer remaining on the surface of the semiconductor arrangement may then be converted to a heat-resistant insulating layer. The polyimide lacquer which is initially applied comprises a mixture of a prepolymerized or primary stage of the polyimide and a suitable volatile organic solvent.

If desired, a layer of such polyimide lacquer can be applied, dried so as to evaporate the solvent, and then coated with a layer 9 composed of one of the earlier noted photo-lacquer materials. After the drying process, the photo-lacquer layer 9 is then selectively exposed and developed (i.e. in the case of a photo-lacquer of the type known as AZ 1350) in such a manner that the portions of the photo-lacquer layer 9 which are removed by an alkaline developer are positioned above the contacts 2 on the body 1. At the same time or substantially concurrently therewith, the alkaline developer reacts with the polyimide material located below the portions of the layer 9 which are attacked by the developer, and causes such polyimide portions to swell or expand to such an extent that they are easily removed, for example, by a water jet while those portions of the polyimide layer under the non-attacked portions of the photo-lacquer layer remain on the surface of the semiconductor arrangement (FIG. 3).

The photo-lacquer layer 9 overlying the polyimide layer 8 may be removed in a subsequent step, for example, by acetone or it may be allowed to remain and during the heat treatment of the polyimide, be converted into a heat-resistant layer which remains on the surface of the polyimide layer as a further protective organic layer. As indicated earlier, the heat-treatment of the polyimide involves temperatures of at least about 300° C. for a time period of about 30 minutes.

A structure having a heat-resistant organic insulating layer 8, as shown at FIG. 4, may then be provided across the entire surface thereof with a relatively thin layer 4, for example, composed of Ti. Such a thin Ti layer improves the adhesive strength of the soft-solderable metal, such as Cu, to the contact 2, for example, composed of Al. Further, the Ti layer also prevents the diffusion of Cu atoms into the semiconductor crystal. Thereafter, Cu may be applied onto the Ti layer 4. The Ti layer and at least a portion of the substantially thicker Cu layer 6 which is adjacent to the Ti layer are preferably applied by vapor deposition at increased temperatures. The insulating layer 8 composed of a heat-stabilized photo-lacquer or polyimide allows the use of vaporization temperatures of about 400° C. The Ti layer 4 is preferably applied in a thickness of about 0.5 μm while the Cu layer 6 is preferably applied in a thickness of about 30 to 50 μm, for example, about 35 μm and the insulating layer 8 is applied in a thickness of about 4 to 5 μm.

The metal layers 4 and 6 are first applied over the entire surface and are then etched to a desired dimension, such as generally shown at FIG. 5. Conventional etching techniques using a photo-lacquer etch mask 10 may be utilized. The mask 10 is dimensioned so that only each contact on the semiconductor body retains a Cu bump thereon. After the semiconductor device is completed, such Cu bumps may be soldered to a contacting wire.

In place of Ti, Cr may be used for the intermediate metal layer 4 and Ni or Pt or Pd may be used instead of Al for the metal contacts. If silicon is used as the semiconductor material, platinum silicide or palladium silicide may be used. As the soft-solderable metal, Cu may be replaced by Ag, Pb, Fe, Sn or In.

The intermediate metal layer 4 may be composed of two or more layers of different metals which are successively deposited one above the other. For example, a lower Ti layer may be coated with an Au layer onto which a thick Cu or Ag layer is then applied. The upper layer 6 of a soft-solderable metal may be provided with a different metal on its outer portions. For example, an inner Cu layer may be reinforced by immersion into a tin or lead bath for the application of a layer of tin or lead onto the Cu layer. Of course, other conventional metal coating techniques may also be used to apply desired metal.

The insulating layer 8 may also be composed of the following materials:

1. Polyphenylene $\left(-\underset{}{\bigcirc}-\underset{}{\bigcirc}-\right)_x$ wherein x is a numeral ranging from 100 to 1000

2. Polyxylene $\left(-CH_2-\underset{}{\bigcirc}-CH_2-\underset{}{\bigcirc}-CH_2-\right)$ 3. Polysioxane (—Si—O—Si—) silicone By suitable selection of photo-lacquer developers and/or organic solvents so that they do not react with the above materials, the so-called plasma incineration process may be used for uncovering the contact 2. This is accomplished by subjecting the areas of the insulating organic material which are to be removed to a glow discharge in the presence of oxygen at a pressure of about 1 to 10 Torr. The portions of the insulating material which are to remain on the semiconductor arrangement must be suitably covered or protected. For example, a photo-lacquer mask which has a thickness substantially greater than that of the area of the insulating material being removed may be used for this purpose. Also, a mask composed of a non-oxidizing metal may also be used, for example, in the form of a sprayed-on layer which is formed by a photo-lacquer etching technique.

I claim as my invention:

1. In a method of producing electrical contacts on a semiconductor device wherein a semiconductor body is provided with at least one metal contact layer, the area around each such contact layer is completely coated with an insulating layer leaving free a contact surface on each such metal contact layer, at least two different metal layers are additionally successively applied onto each one of said contact surfaces so that the outer metal layer consists of a soft-solderable metal and has a thickness substantially greater than that of the two other metal layers combined, and any excess metal on said insulating layer is removed by a photo-lacquer etching technique, the improvement which comprises:
   vapor depositing as each of said metal contact layers an aluminum layer,
   applying a layer of a heat-resistant organic insulating material selected from the group consisting of polyphenylene, polyxylene, and polysiloxane, as said insulating layer,
   vapor depositing as a first one of said two additional metal layers a layer of titanium onto each one of said contact surfaces,
   applying as the outer one of said two additional metal layers a layer of soft-solderable metal selected from the group consisting of copper and silver, and
   removing any excess of such additional metals from said insulating layer on areas around each one of said contact surfaces by etching while using an etch mask composed of a photo-lacquer.

2. The method of claim 1 wherein said insulating layer is heat-stabilized after application thereof by heating to a temperature from about 300° to 400° C. for a time period of about 30 minutes.

3. The method of claim 1 wherein said insulating layer is removed from the metal contacts by a masked plasma incineration process.

4. A semiconductor device produced in accordance with the method defined in claim 1.

* * * * *